United States Patent
Yeo et al.

(10) Patent No.: US 7,499,694 B1
(45) Date of Patent: Mar. 3, 2009

(54) TUNER ALIGNMENT

(75) Inventors: Alan Chin Leong Yeo, Singapore (SG); Han Leng Paxton Tan, Singapore (SG); Johannes Hubertus Antonius Brekelmans, Nederweert (NL)

(73) Assignee: NXP B.V., Eindhoven (NL)

( * ) Notice: Subject to any disclaimer, the term of this patent is extended or adjusted under 35 U.S.C. 154(b) by 824 days.

(21) Appl. No.: 09/890,490

(22) PCT Filed: Nov. 27, 2000

(86) PCT No.: PCT/EP00/11826

§ 371 (c)(1),
(2), (4) Date: Jul. 31, 2001

(87) PCT Pub. No.: WO01/41424

PCT Pub. Date: Jun. 7, 2001

(30) Foreign Application Priority Data

Dec. 1, 1999 (WO) .................. PCT/SG99/00134

(51) Int. Cl.
*H04B 1/16* (2006.01)
*H04B 7/00* (2006.01)

(52) U.S. Cl. .................. 455/339; 455/340; 455/230; 455/266

(58) Field of Classification Search ... 455/226.1–226.3, 455/227, 232.1, 255, 266, 339, 340, 150.1, 455/161.1, 161.3, 182.3, 184.1, 192.3, 195.1
See application file for complete search history.

(56) References Cited

U.S. PATENT DOCUMENTS

| | | | | |
|---|---|---|---|---|
| 4,399,559 A | * | 8/1983 | Theriault | 455/179.1 |
| 4,402,089 A | * | 8/1983 | Knight et al. | 455/186.1 |
| 4,939,789 A | * | 7/1990 | Sakashita et al. | 455/260 |
| 5,179,302 A | * | 1/1993 | Wagner | 327/553 |
| 5,280,638 A | * | 1/1994 | Porambo et al. | 455/143 |
| 5,404,161 A | * | 4/1995 | Douglass et al. | 725/15 |
| 5,438,699 A | * | 8/1995 | Coveley | 455/67.14 |
| 5,678,211 A | * | 10/1997 | Badger | 455/191.1 |
| 5,721,756 A | * | 2/1998 | Liebetreu et al. | 375/344 |
| 5,752,179 A | * | 5/1998 | Dobrovolny | 455/266 |
| 5,930,696 A | * | 7/1999 | Tzuang et al. | 455/311 |
| 5,949,832 A | * | 9/1999 | Liebetreu et al. | 375/344 |
| 5,963,856 A | * | 10/1999 | Kim | 455/307 |
| 6,070,062 A | * | 5/2000 | Yoshida et al. | 455/234.1 |
| 6,169,569 B1 | * | 1/2001 | Widmer et al. | 725/111 |
| 6,307,442 B1 | * | 10/2001 | Meyer et al. | 333/17.1 |
| 6,307,443 B1 | * | 10/2001 | Gabara | 333/17.1 |
| 6,463,266 B1 | * | 10/2002 | Shohara | 455/196.1 |
| 6,560,270 B1 | * | 5/2003 | Hischke | 375/136 |
| 6,724,440 B1 | * | 4/2004 | Suan et al. | 348/731 |
| 7,072,783 B2 | * | 7/2006 | Makhlouf et al. | 702/69 |

FOREIGN PATENT DOCUMENTS

JP 07-297779 * 11/1995

* cited by examiner

*Primary Examiner*—Duc M Nguyen

(57) ABSTRACT

In a method of tuning a receiver for a digital signal (MPEG2-TS), an input signal (RF-in) is filtered (In-filt, Band-filt) to obtain a processed signal, a digital figure of merit (BER) is determined (Mix/Osc/IF amp IF-downconv-2, C) from the processed signal, and the filtering step (In-filt, Band-filt) is fine-adjusted (μP, PLL, DAC1-DAC3) in dependence on the digital figure of merit (BER).

9 Claims, 1 Drawing Sheet

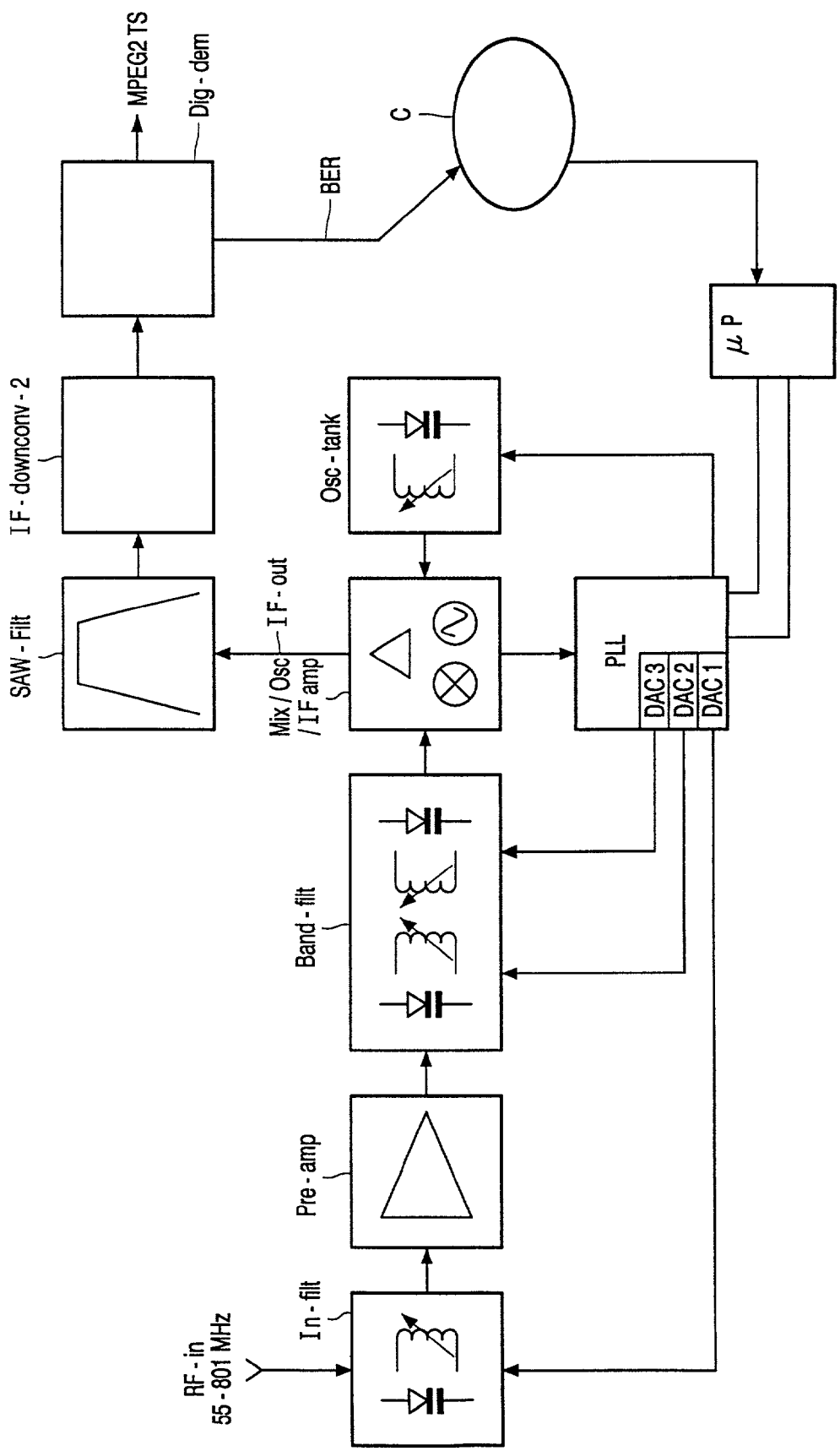

TUNER ALIGNMENT

The invention relates to a tuning method and a receiver for a digital signal, such as an MPEG2 transport stream.

The article "Fully automatic self alignment of TV-tuners", by Gerd M. Maier, in IEEE Transactions on Consumer Electronics, Vol. CE-32, No. 3, Aug. 1986, pp. 302-305, discloses a dynamic alignment system that consists of an oscillator, a PLL system, 3×6 bit D/A converters, a mixer, and a sample and hold circuit. The alignment process is started by selecting the desired TV channel. The PLL data, which sets the tuner oscillator to the correct frequency, will be calculated and PLL data stored. The RF filter alignment is carried out as follows. An input transistor stage receives an AGC voltage of around 1 V in order to block all antenna signals from the RF 2-pole filter. The secondary filter will be set to either 1 or 30 V, the primary filter initialized, and the alignment subroutine activated. Following the alignment of the primary filter to maximum, it will be set to either 1 or 30 V. Then the secondary filter is initialized and again the alignment subroutine is activated. After this procedure is finished, the primary filter will be set to its proper tuning voltage value. The PLL is set to PLL +2.75 MHz in case of the German TV standard, where a 5.5 MHz difference exists between the picture and sound carrier frequencies. The AGC goes to 7V to allow maximum gain (uncontrolled) in the input stage. The antenna filter is initialized and again the alignment routine started; after this run is completed the PLL goes to PLL −2.75 MHz which is the correct oscillator frequency for the desired TV channel. The alignment is finished and the TV set brought back in the received mode.

Every channel change incurs a total re-alignment of the tuner in such a manner, that when one filter is being aligned, the others are put in a reference state. An analysis of a prototype showed that the whole alignment procedure is finished within 300 ms, which is relatively long. Considering that in a digital receiver there are more loops to be locked than just the RF receiver block and that this block is the main contributor to the channel switching time, even the current 150 ms specified for tuners may be too slow. In addition, the tuner alignment sequence seems not to take into account the response of the signal arriving at the antenna input, which may not be nominally flat. This prior art solution also calls for an additional mixer block to generate the signal needed for alignment of the primary and secondary tuner circuits.

Single conversion tuners make use of sets of tracking filters to suppress unwanted signals before converting the incoming signal to the intermediate frequency. Due to the range of coverage of the filters, wide ranging impedance and varying Q values with frequency, it is difficult to maintain consistent frequency response without incurring tremendous cost increase in terms of material and process.

EP-A-0,176,144 discloses a television receiver comprising an automatic radio-frequency resonant circuit adjustment circuit. Use is made of two carriers fed to a read frequency input of the receiver, and the product of the amplitudes of the two carriers is formed by means of a detection circuit coupled to an output of the radio-frequency resonant circuit. The adjustment setting of the resonant circuit is effected to a maximum value of this product, thus providing a correct adjustment in a simple way for analog signals.

It is, inter alia, an object of the invention to provide an improved tuner filter alignment for use with digital signals. To this end, the invention provides a tuning method and a receiver for a digital signal as defined in the independent claims. Advantageous embodiments are defined in the dependent claims.

In a method of tuning a receiver for a digital signal in accordance with a primary aspect of the present invention, an input signal is filtered to obtain a processed signal, a digital figure of merit is determined from the processed signal, and the filtering step is fine-adjusted in dependence on the digital figure of merit. The digital figure of merit may be a bit-error rate. Preferably, the digital figure of merit is a signal quality indicator signal generated in conformity with our non-prepublished U.S. patent application Ser. No. 09/282,322, filed on Mar. 31, 1999.

It is noted that the use of a bit-error rate is known as such from completely different types of circuits. U.S. Pat. No. 4,639,682 discloses a carrier reproducing circuit for phase shift keying signals. A frequency converter converts the frequency of a PSK signal into a frequency of a carrier to be reproduced. A carrier reproducing circuit includes a PLL circuit that reproduces the carrier. The intended data in the reproduced carrier is demodulated. A frequency correction data generator forms correction data according to a bit-error rate of the demodulated data, and superposes the correction data on a control voltage to a voltage controlled oscillator of the PLL circuit.

U.S. Pat. No. 5,065,107 discloses a phase-locked loop bandwidth switching demodulator for suppressed carrier signals. A variable frequency oscillator is responsive to a control signal for oscillating at a frequency corresponding to an intermediate frequency A frequency difference detector produces an output signal indicative of the frequency difference between the frequency of the input signal and the intermediate frequency. A feedback loop network has a narrow-band path and a wide-band path and is responsive to a detector output signal for producing a control signal and applying the control signal to an oscillator through one of the paths whereby to change the intermediate frequency of the oscillator in response to the control signal. A quality detector is responsive to the detector output signal for producing a signal corresponding to a bit-error rate of the input signal. A selection means is responsive to the bit-error rate signal for causing the control signal to pass through the narrow-band path when the bit-error rate signal is below a predetermined threshold, and through the wide-band path when the bit-error rate signal exceeds the predetermined threshold.

These and other aspects of the invention will be apparent from and elucidated with reference to the embodiments described hereinafter.

The drawing shows an embodiment of a tuner in accordance with the present invention.

The invention is based on the recognition that a dynamic fine-tuning of the RF response of a tuner can overcome the above-mentioned limitation of a single conversion tuner and in effect even compensate for distortions in the transmission network. The idea calls for a tuner that is aligned much in the normal way, by manually adjusting wire-wound air-coils. Assuming that this already brings the performance to about 80% right, then fine-tuning can deliver the remaining 20%. The 80% performance level of the RF response is likely sufficient for a digital receiver to acquire lock and for synchronization to take place. Tuner alignment improvement is then a matter of individually tuning the RF circuits until a digital figure of merit (for example, the bit-error rate) reaches its best value.

The drawing shows an embodiment of a tuner in accordance with the present invention. An RF input signal RF-in (55.801 MHz) is applied to an input filter In-filt. Its output signal is applied to a double tuned band-filter Band-filt thru a pre-amplifier Pre-amp. An output signal of the double tuned band-filter Band-filt is applied to a mixer/oscillator/IF amplifier circuit Mix/Osc/IF amp forming a tuner mixer stage that furnishes the IF output signal IF-out at e.g. 45.75 MHz. Another output of the mixer/oscillator/IF amplifier circuit Mix/Osc/IF amp is coupled to an input of a PLL IC with multiple tuning voltage outputs. The PLL circuit controls the input filter In-filt, the double tuned band-filter Band-filt, and an oscillator tank circuit Osc-tank forming the tuner local oscillator and having an output coupled to the mixer/oscillator/IF amplifier circuit Mix/Osc/IF amp. The coils are used for factory alignment. They are opened or closed (pushed with a stick) until a desired response is achieved.

The IF output signal IF-out is applied to a second IF downconverter IF-downconv-2 thru a SAW filter SAW-filt. An output of the second IF down-converter IF-downconv-2 is coupled to a digital demodulator Dig-dem that furnishes, for example, an MPEG-2 transport stream MPEG2 TS. The digital demodulator Dig-dem contains an equalizer.

Error information such as a bit-error rate BER or, preferably, a signal quality indicator signal generated in conformity with our non-prepublished U.S. patent application Ser. No. 09/282,322, filed on Mar. 31, 1999, (made) available in the digital demodulator Dig-dem is applied to a micro-processor µP after an optional conditioning in a conditioning block C. The micro-processor HP controls three D/A converters DAC1, DAC2 and DAC3 contained in the PLL IC in accordance with the algorithm set out below.

A preferred fine-tuning algorithm comprises the following steps:

1. Change to a new channel. If there is no lock, signal an error. If there is a lock, go on with the following steps.

2. Fine-tune DAC1 that controls the input filter.

3. Fine-tune DAC2 that controls the primary filter of the double-tuned band-filter.

4. Fine-tune DAC3 that controls the secondary filter of the double-tuned band-filter.

Each of the fine-tuning actions 2-4 comprises the following steps:

a. Increase the DAC offset. If this reduces the bit-error rate, repeat this step a.

b. Decrease the DAC offset. If this reduces the bit-error rate, repeat this step b.

c. Increase the DAC offset.

So, when a channel change is triggered, the tuner receives the standard command via an inter-IC bus (I²C) to change band (if necessary) and tune the oscillator to the correct oscillator frequency. At this point, picture is available, even though the specified RF response flatness and/or bit-error rate threshold for quasi-error-free (QEF) is not yet reached.

Keeping the primary and secondary circuits of a tuner as they are, the center frequency of the input filter In-filt is varied by means of an offset on DAC1. This moves first in a positive direction. Assuming that the positive offset resulted in an improvement (decrease) of the bit-error rate, then this should continue until the bit-error rate reaches its point of inflection (minimum). If increasing the offset results in a worsening bit-error rate, then the control starts decreasing the offset until the point of inflection is found. Because finding an inflection point requires departing from the optimal setting, the last step is to make a positive offset before branching back to the main routine.

The same is repeated for DAC2 and DAC3 connected to the primary and secondary bandpass circuits of the double-tuned band-filter Band-filt of the tuner, respectively.

At the end of the exercise, the tuner alignment is at best. Given the characteristics of the transmission system, it is hypothesized that the frequency response will be virtually at its most flat in case there are no interferences or signal impairments, or a maximum rejection of an undesired interfering signal, usually one or more channels away, is obtained at an RF response curve that will be far from flat.

One of the considerations is that the offset change steps taken by the DACs cannot be too large as to cause too severe a change in the response. In the worst case, synchronization could be lost. An optimal fine-tuning can be obtained with variable offset sizes at different frequency points.

In this preferred embodiment, the filters are aligned successively. When the first filter is aligned, the second and third filters are in the factory pre-aligned state. When the second filter is aligned, the first filter is in the fine-aligned state while the third filter is in the factory pre-aligned state. When the third filter is aligned, both the first and second filters are in the fine-aligned state.

Preferably, a pre-alignment is carried out "in-factory" by applying a swept signal at the input of the device and detecting the output. This output (which is the superposition of the 3 sets of filter response and in some cases an additional IF filter) is tuned manually by pushing/stretching wire wound air coils with DAC offset voltages set to 0. This procedure is in fact the same as that carried out for standard tuners produced today. The pre-aligned tuner supports the fast acquisition of signals, which is an important point of consideration in TV applications.

A preferred embodiment of the invention is formed by a receiver block with a tuner utilizing a PLL IC with multiple DACs. This allows each tuned circuit in the tuner to be independently tuned. By monitoring an error signal downstream of the receiver chain, the individual tuning voltages can be manipulated so as to arrive at the optimum alignment for best signal quality.

For an analog TV system a direct link exists between channel (tuner) tilt and video response. For any of the digital modulation schemes this is, however, no longer the case. Tilt will translate in a loss of receiver margin, one of which for example the sensitivity. If one looks at the spectral shape of multi-path RF signals arriving at the input of a digital terrestrial receiver you will find severe distortions, way beyond what can be corrected for by the digital demodulator (equalizer). So, rather than fine tuning the RF response to maximum flatness, the invention offers the ability to improve receiving conditions by deliberately distorting the tuner RF response. This (linear) distortion serves the purpose of creating more favorable signal conditions at the tuner mixer stage and the IF SAW driver. This can, however, only work in conjunction with an equalizer further on in the chain, which equalizer again eliminates the distortions of the desired signal. Take for example an N-2 interference condition. By moving the RF response curve in its totality nearer to the Local Oscillator (shift all RF circuits in tandem) a (probably considerable) amount of additional selectivity can be achieved. Same so for any other taboo channel the rejection of which relies on RF selectivity. The essential difference with a standard tuner is that for the latter there is a limit to the attainable selectivity induced by need for flat RF response, component tolerance (varicaps) and alignment inaccuracy. A dynamically optimized RF response may allow better overall results without making tuner a lot more expensive. So, depending on the signal conditions, the best optimized response may not look like what we are familiar with (i.e. a flat symmetrical response) but could instead be a skewed curve to favor the desired signal and block out (attenuate) any strong interferences.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A receiver for a digital signal, the receiver comprising:
one or more filters that are configured to filter an input signal to obtain a processed signal, wherein the one or more filters include:
an input filter; and
a double tuned band-filter;
a decoder that is configured to determine a digital figure of merit from the processed signal; and
a controller that is configured to determine a center frequency of at least one of the one or more filters by determining a point of inflection of said digital figure of merit by:
incrementally adjusting said center frequency in a first direction;
determining a degradation in said figure of merit;
incrementally adjusting said center frequency in a second direction;
determining a degradation in said figure of merit; and
adjusting said center frequency in said first direction, wherein a center frequency of each of said other filters is held stationary.

2. The receiver of claim 1, further including:
a pre-amp that is configured to operably couple the input filter to the band-filter, and
a mixer that is configured to generate an IF signal from an output of the band-filter, wherein, the decoder is configured to receive the IF signal and to produce therefrom a digital output signal and the figure of merit.

3. A method comprising:
receiving an RF input signal,
filtering the RF input signal via one or more RF filters to provide a filtered RF signal,
mixing the filtered RF signal with an oscillator signal to provide an IF signal,
demodulating the IF signal to provide a digital output signal and a figure of merit associated with the digital output signal, and
adjusting at least one filter of the one or more RF filters based on the figure of merit by:
incrementally adjusting said center frequency in a first direction;
determining a degradation in said figure of merit;
incrementally adjusting said center frequency in a second direction;
determining a degradation in said figure of merit; and
adjusting said center frequency in said first direction, wherein said center frequency of each of said other RF filters is held stationary.

4. The method of claim 3, further including: adjusting a center frequency of another filter of the one or more RF filters.

5. The method of claim 3, wherein the adjusting of the center frequency of the at least one filter and the another filter occur sequentially.

6. The method of claim 3, further including: adjusting another filter of the one or more RF filters.

7. The method of claim 6, wherein the adjusting of the at least one filter and the another filter occur sequentially.

8. The method of claim 7, wherein the adjusting of the at least one filter and the another filter are based on a first control signal and a second control signal that are each independently determined based on first and second sequences of figures of merit.

9. The method of claim 3, wherein the figure of merit includes a bit-error rate.

* * * * *